United States Patent [19]

Casey et al.

[11] Patent Number: 5,264,399
[45] Date of Patent: Nov. 23, 1993

[54] CERAMIC COMPOSITE BODY

[75] Inventors: Jon A. Casey, Poughkeepsie; Sylvia M. DeCarr, Wappingers Falls, both of N.Y.

[73] Assignee: International Business Machines Corporation, Armonk, N.Y.

[21] Appl. No.: 874,916

[22] Filed: Apr. 28, 1992

[51] Int. Cl.$^5$ .................. C03C 14/00; C03C 10/08; C03C 10/12; C03C 4/16
[52] U.S. Cl. .......................... 501/32; 501/7; 501/9; 501/17; 501/65; 501/66
[58] Field of Search .............. 501/7, 9, 17, 32, 65, 501/66, 95

[56] References Cited

U.S. PATENT DOCUMENTS

| | | | |
|---|---|---|---|
| 3,715,196 | 2/1973 | Montierth | 65/33 |
| 3,940,277 | 2/1976 | Pierson et al. | 106/39.6 |
| 4,391,324 | 11/1981 | Kumer et al. | 174/68.5 |
| 4,510,917 | 9/1986 | Yamamura et al. | 428/224 |
| 4,527,160 | 12/1986 | Herron et al. | 29/830 |
| 4,598,167 | 7/1986 | Ushifusa et al. | 501/66 X |
| 4,755,490 | 7/1988 | DiLazzaro | 501/32 X |
| 4,764,233 | 8/1988 | Ogihara et al. | 501/65 X |
| 4,855,259 | 8/1989 | Claussen et al. | 501/9 |
| 4,879,261 | 11/1989 | Burn | 501/32 |
| 4,962,070 | 10/1990 | Sullivan | 501/95 |
| 5,068,210 | 11/1991 | DiLazzaro et al. | 501/32 |
| 5,071,793 | 12/1991 | Jean et al. | 501/65 X |

FOREIGN PATENT DOCUMENTS 2168338A 6/1986 United Kingdom .

OTHER PUBLICATIONS

Meyer, et al., "Reinforcing Fused Silica with High Purity Fibers", Ceramic Engineering Science Proc., vol. 6, pp. 646–656 (1985).

*Primary Examiner*—Karl Group
*Attorney, Agent, or Firm*—Ira David Blecker

[57] ABSTRACT

A ceramic composite body which includes high purity amorphous silica fibers in a ceramic matrix. The ceramic matrix may be a glass ceramic material, a borosilicate glass material or mixtures thereof.

9 Claims, No Drawings

CERAMIC COMPOSITE BODY

SUMMARY OF THE INVENTION

The present invention relates to the field of co-fired glass and/or ceramic (hereafter just ceramic) structures and, more particularly, to ceramic structures which contain fibers to enhance their mechanical and/or electrical properties.

BACKGROUND OF THE INVENTION

Ceramic structures, usually and preferably multilayered, are used in the production of electronic substrates and devices. Many different types of structures can be used, and a few of these structures are described below. For example, a multilayered ceramic circuit substrate may comprise patterned metal layers which act as electrical conductors sandwiched between ceramic layers which act as insulators. The substrates may be designed with termination pads for attaching semiconductor chips, connector leads, capacitors, resistors, covers, etc. Interconnection between buried conductor levels can be achieved through vias formed by metal paste-filled holes in the individual ceramic layers formed prior to lamination, which, upon sintering, will become a sintered dense metal interconnection of metal-based conductor.

In general, conventional ceramic structures are formed from ceramic greensheets which are prepared by mixing a ceramic particulate, a catalyst (e.g., such as that disclosed in Herron et. al., U.S. Pat. No. 4,627,160), a thermoplastic polymeric binder, plasticizers and solvents. This composition is spread or cast into ceramic sheets or slips from which the solvents are subsequently volatilized to provide coherent and self-supporting flexible green sheets. After blanking, stacking and laminating, the greensheets are eventually fired at temperatures sufficient to drive off the polymeric binder resin and sinter the ceramic particulates together into a densified ceramic substrate.

The electrical conductors used in formation of the electronic substrate may be high melting point metals such as molybdenum and tungsten or a noble metal such as gold. However, it is more desirable to use a conductor having a low electrical resistance and low cost, such as copper and alloys thereof.

In the area of electronic packaging, there are increasing demands for improvements in performance. Current state-of-the art materials include the cordierite glass ceramic materials disclosed in Kumar et. al. U.S. Pat. No. 4,301,324, the disclosure of which is incorporated by reference herein. These glass ceramic materials have a dielectric constant of about 5.0 and a thermal coefficient of expansion (TCE) of about $30 \times 10^{-7}/°C$. that closely matches that of silicon. It would be desirable to have a substrate material with a dielectric constant of less than 5.0 to reduce signal propagation delay, strength and toughness at least equal to that of the glass ceramics, and a thermal coefficient of expansion close to that of silicon. In order to meet these demands, alternate substrate materials are being investigated.

Fused silica has been proposed for use as a substrate material, since it has a dielectric constant much less than 5.0, but its thermal coefficient of expansion is much less than that of the silicon devices which are placed on the substrate. Significant differences in thermal coefficients of expansion between the substrate material and the silica device lead to thermal stresses in use, thereby making fused silica of limited use as a pure substrate material.

Among the substrate materials being investigated by the present inventors are composites, which might consist of a ceramic matrix plus fibers or whiskers. Silicon nitride whiskers in a glass ceramic matrix are but one example of such a composite material.

Others have investigated composite materials as well. UK Patent 2 168 338 discloses a molded ceramic body consisting of fibers in a ceramic refractory material. The fibers may be, for example, silica, and the refractory material may be, for example, an aluminosilicate material such as cordierite or a silica material such as quartz. The porosity of the body varied across the ceramic body from 20 to 70%.

Sullivan U.S. Pat. No. 4,962,070 discloses a ceramic body comprised of silica-coated carbon fibers in a cordierite matrix. Generally, the dielectric properties of carbonaceous-based fiber are very poor.

Claussen et. al. U.S. Pat. No. 4,855,259 discloses cordierite bodies containing, for example, silicon nitride, silicon carbide, alumina, magnesium or mullite fibers.

Montierth U.S. Pat. No. 3,715,196 discloses a cementing composition for bonding together glass-ceramic structures. The cementing composition comprises a thermally devitrifiable glass (which upon devitrification may form, e.g., cordierite) and a fiber-flux mixture comprising fused (amorphous) silica fibers.

Yamamura et. al. U.S. Pat. No. 4,610,917 discloses a composite material consisting of fibers containing silicon, either titanium or zirconium, nitrogen and oxygen in a glass ceramic matrix.

Pierson et. al. U.S. Pat. No. 3,940,277 discloses glass ceramic articles in which crystalline silica fibers are formed in situ.

Meyer et. al., "Reinforcing Fused Silica with High Purity Fibers", Ceramic Engineering Science Proc., Vol. 6 [7-8], pp. 646-656 (1985), discloses high purity fused silica fibers dispersed in a high purity fused silica matrix.

Notwithstanding the efforts of those concerned with the present problem, there nevertheless remains a need for a substrate material with a dielectric constant of less than 5.0 and acceptable strength and toughness values.

Accordingly, it is an object of the present invention to have a substrate material with a dielectric constant of less than 5.0 and acceptable strength and toughness values.

It is another object of the present invention to have a substrate material that has a thermal coefficient of expansion close to that of silicon.

These and other objects of the invention will become apparent after referring to the following detailed description of the invention.

BRIEF SUMMARY OF THE INVENTION

The objects of the invention have been achieved by providing a ceramic composite body comprising high purity amorphous silica fibers in a ceramic matrix. The ceramic matrix is selected from the group consisting of glass ceramics, borosilicate glasses and mixtures thereof.

DETAILED DESCRIPTION OF THE INVENTION

According to the invention, there is disclosed a ceramic composite body comprising high purity amorphous silica ($SiO_2$) fibers in a ceramic matrix. The ceramic matrix may be a glass ceramic, borosilicate glass material or mixture thereof.

It has been found that such ceramic composite bodies have a lowered dielectric constant while maintaining nearly the same level of strength as glass ceramics or borosilicate glasses alone.

The glass ceramic material may be the cordierite and spodumene glass ceramic materials disclosed in the Kumar et. al. U.S. Pat. No. 4,301,324 mentioned above. Other glass ceramic materials include, for example, eucryptite and anorthite. Glass ceramic materials are a recognized class of materials which begin as glasses but upon heating undergo devitrification and become at least partially crystallized. Some examples are given in Table I.

As to the borosilicate glasses, the preferred glasses are those that have a thermal coefficient of expansion of about $30.33 \cdot 10^{-7}/°C$. (or roughly equivalent to that of silicon) and a dielectric constant of about 4. One example of such a borosilicate glass is Corning 7070 (Trademark of Corning Inc, Corning, NY) and has a composition, in weight percent, consisting of 71% $SiO_2$, 26% $B_2O_3$, 1% $Al_2O_3$, 0.5% $Na_2O$, and 1% $K_2O$.

Mixtures of the glass ceramic and borosilicate glass materials are also contemplated within the scope of the present invention.

material could cause any product containing the crystalline fibers to crack.

High purity amorphous silica fibers are necessary because they have a low dielectric loss tangent, which means that it is a low noise material. It should be understood that high purity amorphous silica shall define a material which contains approximately 99% or more amorphous silica and is devoid of any metallic species.

It has further been found that fibers are particularly advantageous to the present invention. Fibers can be roughly defined as having an aspect ratio of above 3. For a given volume percent of additive, fibers will lower the dielectric constant more than an equivalent amount of particulate material. Additionally, fibers will maintain the strength and toughness of the material more than will particulate matter. The reason for these results is that higher aspect ratio materials tend to increase strength more and create more void volume (thereby leading to a lower dielectric constant) than lower aspect ratio materials.

It is preferred that there be 1 to 40 volume percent, and more preferably 10 to 25 volume percent, of high purity amorphous silica fibers in the ceramic matrix. At 1 volume percent, there will begin to be some effect on the physical and electrical properties of the material. This effect will become significant at about 10 volume percent. At the other end of the range, 40 volume per-

TABLE 1

| GLASS CERAMIC COMPOSITIONS (WEIGHT PERCENT) | | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| $SiO_2$ | 55.0 | 54.5 | 54.5 | 52.3 | 57.8 | 60.0 | 50.0 | 53.9 | 54.0 | 55.0 | 60.0 | 54.5 |
| $Al_2O_3$ | 21.1 | 21.0 | 21.0 | 19.7 | 22.2 | 18.2 | 22.9 | 20.7 | 21.0 | 21.0 | 17.0 | 20.0 |
| MgO | 22.3 | 19.8 | 19.8 | 24.0 | 16.0 | 17.8 | 22.2 | 19.6 | 19.0 | 18.0 | 18.0 | 20.0 |
| $B_2O_3$ | 1.3 | 1.0 | 1.0 | 1.0 | 1.0 | 1.0 | 1.1 | 1.0 | 1.0 | 1.0 | 1.0 | 1.0 |
| $P_2O_5$ | 0.3 | 2.7 | 2.7 | 3.0 | 3.0 | 3.0 | 1.8 | 2.8 | 3.0 | 3.0 | 3.0 | 1.5 |
| $C3O_2$ | | 1.0 | | | | | | | | | | |
| MnO | | | 1.0 | | | | | | | | | |
| $ZrO_2$ | | | | | | | | 2.0 | | | | 2.0 |
| CaO | | | | | | | | | 2.0 | | | 1.0 |
| NiO | | | | | | | | | | 2.0 | | |
| $Li_2O$ | | | | | | | | | | | 1.0 | |
| $Fe_2O_3$ | | | | | | | | | | | | |
| $Na_2O$ | | | | | | | | | | | | |
| $TiO_3$ | | | | | | | | | | | | |
| ZnO | | | | | | | | | | | | |
| CuO | | | | | | | | | | | | |

| | 13 | 14 | 15 | 16 | 17 | 18 | 19 | 20 |
|---|---|---|---|---|---|---|---|---|
| $SiO_2$ | 57.0 | 55.0 | 47.0 | 53.9 | 54.0 | 54.5 | 54.0 | 54.0 |
| $Al_2O_3$ | 21.0 | 21.0 | 33.5 | 20.8 | 22.0 | 21.3 | 22.0 | 21.0 |
| MgO | 20.0 | 22.0 | 13.5 | 19.6 | 20.0 | 19.9 | 20.0 | 22.0 |
| $B_2O_3$ | 1.0 | 2.0 | 3.0 | 1.0 | 1.0 | 1.0 | 1.0 | 1.0 |
| $P_2O_5$ | 1.0 | | 3.0 | 2.7 | 2.0 | 2.8 | 2.0 | |
| $C3O_2$ | | | | | | | | |
| MnO | | | | | | | | |
| $ZrO_2$ | | | | | | | | |
| CaO | | | | | | | | |
| NiO | | | | | | | | |
| $Li_2O$ | | | | | | | | |
| $Fe_2O_3$ | | | | 2.0 | | | | |
| $Na_2O$ | | | | | 1.0 | | | |
| $TiO_2$ | | | | | | 1.0 | | |
| ZnO | | | | | | | 1.0 | |
| CuO | | | | | | | | 2.0 | dielectric constant while maintaining strength and toughness, it is necessary to the invention that the silica fibers be both amorphous and high purity. Amorphous silica fibers are necessary because they have a lower dielectric constant and, also, they do not undergo any phase change during the temperature excursions encountered during sintering as compared to crystalline silica. Crystalline silica, such as quartz, undergoes a phase change around 573° C. which is accompanied by a volumetric change. Such a volumetric change of the cent is about the upper limit for the amount of fibers that any given material could contain while maintaining structural integrity. Since increasing the volume percent of the fibers will increase the void volume, at some point there will be so much void volume that the composite body will lose structural integrity and fall apart. It is believed that this upper limit is at about 40 volume percent of fibers in the composite body. Lesser amounts of the fibers will usually be found more advantageous. It is expected that the most useful composite bodies will have a maximum of about 25 volume percent fibers.

These composite ceramic bodies may also be characterized by their porosity. With the lowest amount of fibers present, about 1 volume percent, the bodies will be fully dense. Fully dense usually means no more than about 2% porosity. On the other hand, with 40 volume percent fibers present in the composite body, the body will contain about 45% porosity. In any case, the porosity will be uniformly or evenly distributed throughout the body.

When composite bodies are produced according to the teaching of the present invention, they will have a dielectric constant of 5.0 or less and a thermal coefficient of expansion of about $30 \times 10^{-7}/°C$.

Other objects and advantages of the invention will become more apparent after referring to the following examples.

EXAMPLES

A series of glass ceramic greensheets were made. The greensheets were conventionally tape cast from a slurry containing cordierite-forming particles, polyvinyl butyral binder and other conventional additives such as a copper catalyst, plasticizers, and flow control agents. The cordierite-forming particles fell in the following composition range, in weight percent:

| | |
|---|---|
| $SiO_2$ | 50–55 |
| $Al_2O_3$ | 18–23 |
| MgO | 18–25 |
| $B_2O_3$ | 0–3 |
| $P_2O_5$ | 0–3 |

In addition, the slurry contained high purity amorphous silica fibers (99.8% purity, from Johns Manville), amorphous silica particles (99+% purity, from Kaopolite), or silicon nitride whiskers (99+% purity, from UBE). As a control, some greensheets were prepared without the additional fibers or particles.

The greensheets were sintered according to the following firing cycle. The temperature was ramped up to about 725° C. in forming gas to begin binder pyrolysis. Thereafter, the atmosphere was switched to wet hydrogen for binder burnoff. After changing the atmosphere to nitrogen, the temperature was ramped up to 975° C. and held there for densification and crystallization. Thereafter, the temperature was ramped down to room temperature.

The dielectric constant, porosity, strength and thermal coefficient of expansion (TCE) of each of the composite bodies was measured. The results are tabulated below in Table II.

TABLE II

| | Dielectric Constant | Porosity % | Strength Kpsi | TCE × $10^{-7}/°C$ |
|---|---|---|---|---|
| Control | 5.0 | 0 | 30 | 30 |
| 10 v/o SIP | 4.7 | 4 | 32.5+/−4 | 28 |
| 20 v/o SIP | 4.1 | 8 | 28.4+/−3 | 25 |
| 25 v/o SIP | 3.7 | 15 | 20.2+/−4 | 25 |
| 10 v/o SNW | 4.6 | 5 | 35.1+/−4 | 28 |
| 20 v/o SNW | 3.8 | 25 | 26.8+/−2 | 25 |
| 25 v/o SNW | 3.3 | 35 | 19.2+/−2 | 25 |
| 10 v/o SIF* | 4.1–4.6 | 5 | 34 | 28 |
| 20 v/o SIF* | 3.3–3.8 | 15–25 | 28 | 25 |
| 25 v/o SIF* | 2.8–3.3 | 30–35 | 20 | 25 |

SIP = silica particles in glass ceramic matrix
SNW = silicon nitride whiskers in glass ceramic matrix
SIF = amorphous silica fibers in glass ceramic matrix
*While some samples containing amorphous silica fibers were made, the data is considered to be preliminary; accordingly, the data shown is estimated. However, the values shown in the chart for these amorphous silica fibers are expected based on a comparison of the known properties of amorphous silica particle composite bodies and silicon nitride whisker composite bodies.

The silicon nitride whisker composite bodies are better than the amorphous silica particle composite bodies in terms of dielectric properties relative to strength. The silicon nitride whiskers have higher dielectric values (K=6) than the silica particles (K=3.8) or the glass ceramic (K=5.2), thus the silicon nitride whiskers hurts the dielectric performance but this is overcome by the increased void volume (air) and, thus, lower net dielectric values. The amorphous silica fibers should have a similar effect on the composite body as the silicon nitride whiskers but since they have a lower dielectric constant, they should have an improved (as compared to silicon nitride whiskers and silica particles) lowering effect on the dielectric properties of the composite body.

As can be seen from Table II, for a given amount of additive, the composite bodies containing the amorphous silica fibers are expected to have a lower dielectric constant, higher porosity and higher strength than the composite bodies having the silica particles. It is important to emphasize that for equivalent mechanical properties, the amorphous silica fiber additions will provide better dielectric properties than silica particles.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A ceramic composite body comprising high purity amorphous silica fibers in a ceramic matrix selected from the group consisting of glass ceramics, borosilicate glasses and mixtures thereof wherein said high purity amorphous silica fibers constitute a material which contains at least about 99% amorphous silica and is devoid of any metallic species.

2. The composite body of claim 1 wherein said amorphous silica fibers comprise between about 1 to about 40 volume percent of said composite body.

3. The composite body of claim 2 wherein said amorphous silica fibers comprise between about 10 to about 25 volume percent of said composite body.

4. The composite body of claim 1 wherein said composite body has a dielectric constant of about 5.0 or less and a thermal coefficient of expansion of about $30 \times 10^{-7}/°C$.

5. The composite body of claim 1 wherein said ceramic matrix is a glass ceramic that has a dielectric constant of about 5.0 or less and a thermal coefficient of expansion of about $30 \times 10^{-7}/°C$.

6. The composite body of claim 5 wherein said glass ceramic is cordierite.

7. The composite body of claim 5 wherein said glass ceramic is spodumene.

8. The composite body of claim 1 wherein said ceramic matrix is a borosilicate glass that has a dielectric constant of about 4 and a thermal coefficient of expansion of about $30 \times 10^{-7}/°C$.

9. The composite body of claim 1 and having up to 45 volume % porosity evenly distributed throughout said body.

* * * * *